(12) United States Patent
Wang et al.

(10) Patent No.: US 11,757,077 B2
(45) Date of Patent: Sep. 12, 2023

(54) LIGHT-EMITTING DEVICE

(71) Applicant: EPISTAR CORPORATION, Hsinchu (TW)

(72) Inventors: Hsin-Ying Wang, Hsinchu (TW); Chih-Hao Chen, Hsinchu (TW); Chien-Chih Liao, Hsinchu (TW); Chao-Hsing Chen, Hsinchu (TW); Wu-Tsung Lo, Hsinchu (TW); Tsun-Kai Ko, Hsinchu (TW); Chen Ou, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 155 days.

(21) Appl. No.: 17/306,136

(22) Filed: May 3, 2021

(65) Prior Publication Data
US 2021/0343906 A1    Nov. 4, 2021

Related U.S. Application Data

(60) Provisional application No. 63/019,948, filed on May 4, 2020.

(51) Int. Cl.
| H01L 33/60 | (2010.01) |
| H01L 33/56 | (2010.01) |
| H01L 33/54 | (2010.01) |
| H01L 33/46 | (2010.01) |
| H01L 33/38 | (2010.01) |
| H01L 21/78 | (2006.01) |

(52) U.S. Cl.
CPC .............. *H01L 33/60* (2013.01); *H01L 21/78* (2013.01); *H01L 33/38* (2013.01); *H01L 33/46* (2013.01); *H01L 33/54* (2013.01); *H01L 33/56* (2013.01)

(58) Field of Classification Search
CPC ......... H01L 21/78; H01L 33/44; H01L 33/60; H01L 33/38; H01L 33/46
See application file for complete search history.

(56) References Cited

U.S. PATENT DOCUMENTS

| 2005/0242433 | A1* | 11/2005 | Moriya .............. H01L 27/14636 257/E27.134 |
| 2016/0013361 | A1* | 1/2016 | Chiu ................... H01L 33/0095 438/33 |
| 2016/0111600 | A1* | 4/2016 | Chae ...................... H01L 33/38 257/99 |
| 2021/0359188 | A1* | 11/2021 | Kim ........................ H01L 33/62 |

\* cited by examiner

*Primary Examiner* — Feifei Yeung Lopez
(74) *Attorney, Agent, or Firm* — Patterson + Sheridan, LLP

(57) ABSTRACT

A light-emitting device comprises a substrate comprising a top surface and a sidewall; a semiconductor stack formed on the top surface of the substrate comprising a first semiconductor layer, an active layer and a second semiconductor layer; a dicing street surrounding the semiconductor stack and exposing the top surface of the substrate; a protective layer covering the semiconductor stack and the dicing street; a reflective layer comprising a Distributed Bragg Reflector structure and covering the protective layer; and a cap layer covering the reflective layer, wherein the reflective layer comprises an uneven portion adjacent to the sidewall of the substrate, and the uneven portion comprises an uneven thickness.

20 Claims, 11 Drawing Sheets

LIGHT-EMITTING DEVICE

REFERENCE TO RELATED APPLICATION

This application claims the right of priority based on U.S. Provisional application Ser. No. 63/019,948, filed on May 4, 2020, and the content of which is hereby incorporated by reference in its entirety.

TECHNICAL FIELD

The application relates to a light-emitting device, and more particularly, to a flip chip light-emitting device comprising a reflective mirror structure.

DESCRIPTION OF BACKGROUND ART

Light-Emitting Diode (LED) is a solid-state semiconductor light-emitting device, which has the advantages of low power consumption, low heat generation, long working lifetime, shockproof, small volume, fast reaction speed and good photoelectric property, such as stable emission wavelength. Therefore, the light-emitting diodes are widely used in the household appliances, the equipment indicators, and the optoelectronic products.

SUMMARY OF THE APPLICATION

In accordance with an embodiment of the present application, a light-emitting device comprises a substrate comprising a top surface and a sidewall; a semiconductor stack formed on the top surface of the substrate comprising a first semiconductor layer, an active layer, and a second semiconductor layer; a dicing street surrounding the semiconductor stack and exposing the top surface of the substrate; a protective layer covering the semiconductor stack and the dicing street; a reflective layer comprising a Distributed Bragg Reflector structure covering the protective layer; and a cap layer covering the reflective layer, wherein the reflective layer comprises an uneven portion adjacent to the sidewall of the substrate, and the uneven portion comprises an uneven thickness.

DETAILED DESCRIPTION OF PREFERRED EMBODIMENTS

In order to make the description of the present application more detailed and complete, please refer to the description of the following embodiments and cooperate with the relevant illustrations. However, the examples shown below are used to illustrate the light-emitting device of the present application, and the present application is not limited to the following embodiments. In addition, the dimensions, materials, shapes, relative arrangements, etc. of the elements described in the embodiments in this specification are not limited to the description, and the scope of the present application is not limited to these, but is merely a description. In addition, the size or positional relationship of the elements shown in each figure is exaggerated for clear description. Furthermore, in the following description, in order to appropriately omit detailed descriptions, elements of the same or similar nature are shown with the same names and symbols.

Figure 1:
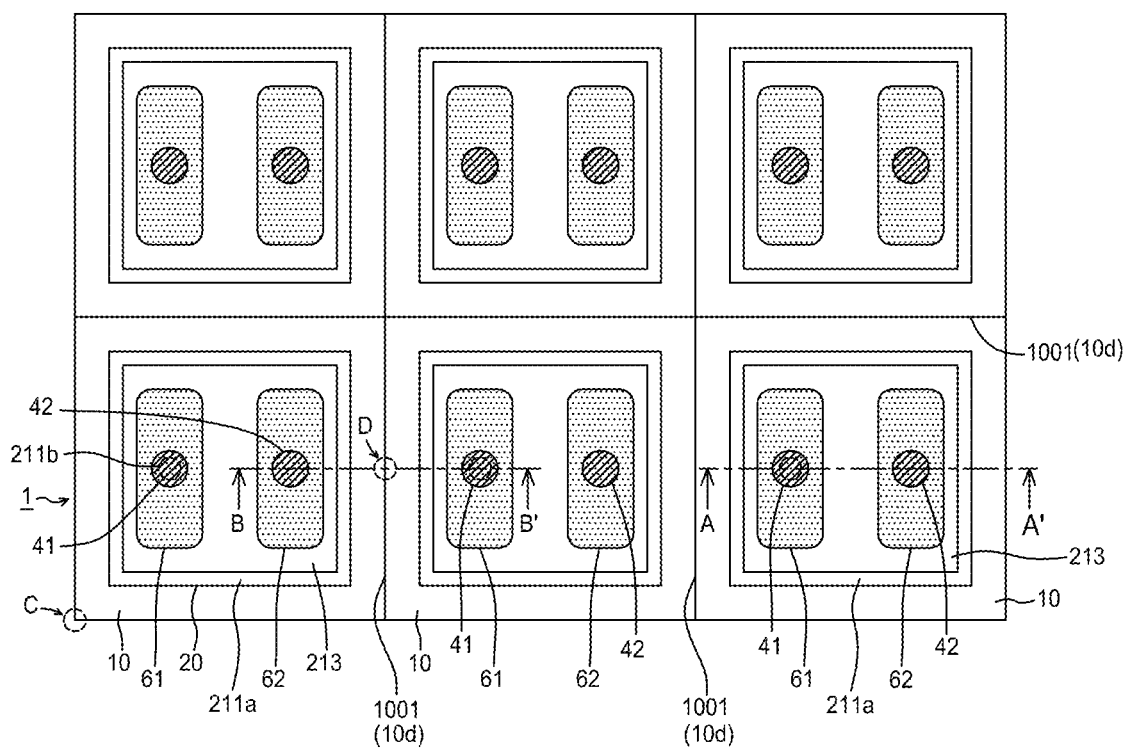
FIG. 1 illustrates a top view of a light-emitting device 1 in accordance with an embodiment of the present application.
Figure 2:
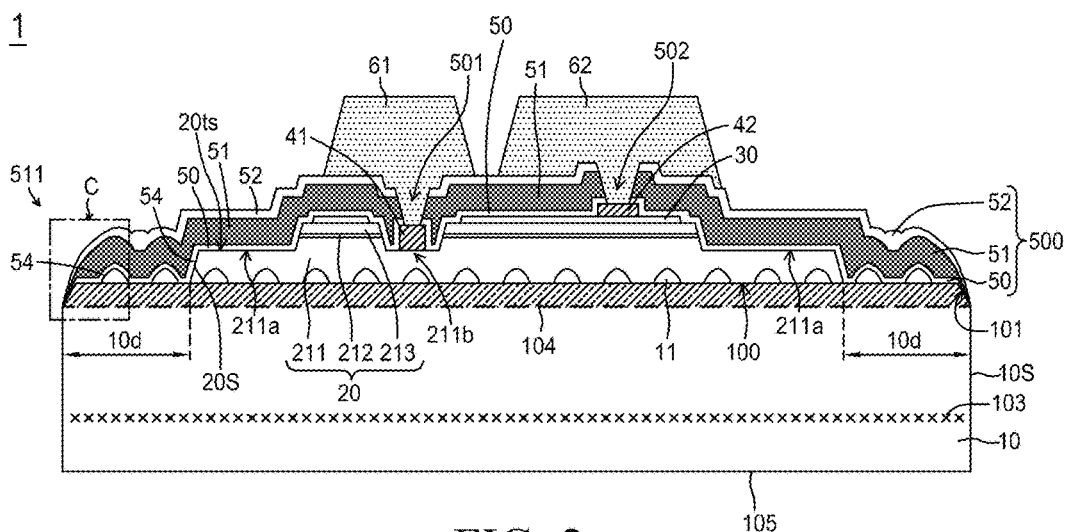
FIG. 2 illustrates a cross-sectional view of the light-emitting device 1 taken along line A-A' of FIG. 1.

FIG. 1 illustrates a top view of a wafer on which a plurality of light-emitting devices 1 is formed in accordance with an embodiment of the present application. FIG. 2 illustrates a cross-sectional view of the light-emitting device 1 taken along line A-A' of FIG. 1.

As shown in FIG. 2, a light-emitting device 1 comprises a substrate 10 comprising a top surface 100 and a sidewall 10S; a semiconductor stack 20 formed on the top surface 100 of the substrate 10 comprising a first semiconductor layer 211, an active layer 212, and a second semiconductor layer 213; a dicing street 10d surrounding the semiconductor stack 20 and exposing the top surface 100 of the substrate 10; a protective layer 50 covering the semiconductor stack 20 and the dicing street 10d; a reflective layer 51 comprising a Distributed Bragg Reflector structure formed on the protective layer 50; and a cap layer 52 covering the reflective layer 51, wherein the reflective layer 51 comprises an uneven portion 511 adjacent to the sidewall 10S of the substrate 10, and the uneven portion 511 comprises an uneven thickness.

The substrate 10 can be a growth substrate for the epitaxial growth of the semiconductor stack 20. The substrate 10 comprises gallium arsenide (GaAs) wafer for growing aluminum gallium indium phosphide (AlGaInP), sapphire ($Al_2O_3$) wafer, gallium nitride (GaN) wafer or silicon carbide (SiC) wafer for growing gallium nitride (GaN), indium gallium nitride (InGaN) or aluminum gallium nitride (AlGaN).

A side of the substrate 10 that is in contact with the semiconductor stack 20 comprises a rough surface. The rough surface comprises a surface having an irregular morphology or a surface having a regular morphology. For example, compared with the top surface 100, the substrate 10 comprises one or a plurality of protrusions 11 protruding from the top surface 100, or one or a plurality of recesses (not shown) recessed from the top surface 100. In a cross-sectional view, the protrusions 11 or the recesses (not shown) comprises hemispheres or pyramids. In order to increase the light-emitting efficiency of the light-emitting device, the protrusion 11 of the substrate 10 comprises a first layer and a second layer (not shown). The first layer comprises the same material as that of the substrate 10, such as gallium arsenide (GaAs), sapphire ($Al_2O_3$), gallium nitride (GaN), silicon carbide (SiC), or aluminum nitride (AlN). The second layer comprises a material different from that of the substrate 10 and that of the first layer. The material of the second layer comprises insulating materials, such as silicon oxide, silicon nitride, or silicon oxynitride. In an embodiment, the refractive index of the material of the second layer is between the refractive indices of the substrate 10 and the semiconductor stack 20. In an embodiment, the dicing street 10d does not comprise the protrusion 11 or the recess. In an embodiment, when the dicing street 10d is formed, the protrusion 11 or the recess on the surface of the substrate 10 can be removed by etching, and the protective layer 50, the reflective layer 51, and the cap layer 52 covering the reflective layer 51 subsequently formed on the dicing street 10d can be better coated. When the material of the protrusion 11 and the substrate 10 are the same and both are materials of the epitaxial growth substrate, the protrusion 11 can be removed by dry etching or wet etching. When the material of the protrusion 11 is an insulating material, the protrusion 11 can be removed by dry etching or wet etching. Dry etching comprises plasma etching, excited state ion etching, inductively coupled plasma etching, or enhanced capacitive coupled plasma etching.

In an embodiment of the present application, the semiconductor stack 20 with photoelectrical characteristics, such as a light-emitting stack, is formed on the substrate 10 by metal organic chemical vapor deposition (MOCVD), molecular beam epitaxy (MBE), hydride vapor phase epitaxy (HVPE), physical vapor deposition (PVD), or ion plating, wherein physical vapor deposition (PVD) comprises sputtering or evaporation.

The semiconductor stack 20 comprises the first semiconductor layer 211, the second semiconductor layer 213, and the active layer 212 formed between the first semiconductor layer 211 and the second semiconductor layer 213. The wavelength of the light emitted from the light-emitting device 1 is adjusted by changing the physical and chemical composition of one or more layers in the semiconductor stack 20. The material of the semiconductor stack 20 comprises a group III-V semiconductor material, such as $Al_xIn_yGa_{(1-x-y)}N$ or $Al_xIn_yGa_{(1-x-y)}P$, wherein $0 \leq x$, $y \leq 1$; $(x+y) \leq 1$. When the material of the semiconductor stack 20 comprises AlInGaP series material, the red light having a wavelength between 610 nm and 650 nm can be emitted. When the material of the semiconductor stack 20 comprises InGaN series material, the blue light having a wavelength between 400 nm and 490 nm can be emitted or the green light having a wavelength between 500 nm and 570 nm can be emitted. When the material of the semiconductor stack 20 comprises AlGaN or AlInGaN series material, the UV light having a wavelength between 250 nm and 400 nm can be emitted.

The first semiconductor layer 211 and the second semiconductor layer 213 can be confinement layers having different conductivity types, electrical properties, polarities, or doping elements for providing electrons or holes. For example, the first semiconductor layer 211 is an n-type semiconductor and the second semiconductor layer 213 is a p-type semiconductor. The active layer 212 is formed between the first semiconductor layer 211 and the second semiconductor layer 213. The electrons and the holes combine in the active layer 212 under a current driving to convert the electric energy into the light energy and then the light is emitted from the active layer 212. The active layer 212 can be a single heterostructure (SH), a double heterostructure (DH), a double-side double heterostructure (DDH), or a multi-quantum well structure (MQW). The material of the active layer 212 can be i-type, p-type, or n-type semiconductor. The first semiconductor layer 211, the second semiconductor layer 213, or the active layer 212 can be a single layer or a structure comprising a plurality of sub-layers.

In an embodiment of the present application, the semiconductor stack 20 further comprises a buffer layer (not shown) formed between the first semiconductor layer 211 and the substrate 10 which can release the stress caused by lattice mismatch between the materials of the substrate 10 and the semiconductor stack 20 so the lattice dislocation and the lattice defect are reduced and the epitaxial quality of the semiconductor stack 20 is improved. The buffer layer comprises a single layer or a structure comprising a plurality of sub-layers. In an embodiment, an aluminum nitride (AlN) layer formed by PVD method can be the buffer layer located between the semiconductor stack 20 and the substrate 10 to improve the epitaxial quality of the semiconductor stack 20. In an embodiment, when the method for forming aluminum nitride (AlN) is PVD, the target can be made of aluminum nitride. In another embodiment, a target made of aluminum reacts with a nitrogen source to form the aluminum nitride.

In an embodiment of the present application, the light-emitting device 1 comprises a first contact electrode 41 and a second contact electrode 42 formed on the same side of the semiconductor stack 20. The light-emitting device 1 can be a flip chip structure or a lateral chip structure.

In the embodiment, by removing a part of the second semiconductor layer 213 and the active layer 212, part of the first semiconductor layer 211 is exposed and a mesa 211a and one or a plurality of first electrical contact regions 211b can be formed. The side surface of the second semiconductor layer 213 and the active layer 212 exposed by etching is an inclined surface with respect to the exposed surface of the first semiconductor layer 211. The first contact electrode 41 is formed on the first electrical contact region 211b to contact the first semiconductor layer 211 and forms an electrical connection with the first semiconductor layer 211. The second contact electrode 42 is formed on the second semiconductor layer 213 and is electrically connected to the second semiconductor layer 213.

In an embodiment of the present application, in order to reduce the contact resistance and improve the current spreading efficiency, the light-emitting device 1 comprises a conductive layer 30 formed between the second semiconductor layer 213 and the second contact electrode 42. The material of the conductive layer 30 comprises a material that is transparent to the light emitted from the active layer 212, such as a metal material with a thickness smaller than 500 Å or a transparent conductive oxide. The transparent conductive oxide comprises indium tin oxide (ITO) or indium zinc oxide (IZO).

In an embodiment of the present application, the light-emitting device 1 comprises one or a plurality of current blocking layers (not shown) formed between the second semiconductor layer 213 and the conductive layer 30 and formed under the second contact electrode 42. The current blocking layer is formed of a non-conductive material comprising aluminum oxide ($Al_2O_3$), silicon nitride ($SiN_x$), silicon oxide ($SiO_x$), titanium oxide ($TiO_x$), or magnesium fluoride ($MgF_x$). In an embodiment, the current blocking layer comprises a Distributed Bragg Reflector (DBR), where the Distributed Bragg Reflector comprises insulating materials with different refractive indexes stacked on each other. In order to increase the light extraction efficiency of the light-emitting device, the current blocking layer has a light reflectivity of more than 80% for the light emitted from the active layer 212.

An insulating reflective structure 500 covers the semiconductor stack 20, the first contact electrode 41 and the second contact electrode 42 to reflect the light from the active layer 212 to a side of the substrate 10, such as the bottom surface 105 of the substrate 10. In the embodiment, in order to reduce the light absorbed by the metal reflective film, the insulating reflective structure 500 comprises an insulating material. The insulating reflective structure 500 may be formed as a single layer or a multilayer, but is preferably a multilayer structure. Specifically, the structure of the insulating reflective structure 500 is formed by sequentially stacking the protective layer 50, the reflective layer 51 and the cap layer 52, wherein the reflective layer 51 comprises a Distributed Bragg Reflector (DBR) structure.

In an embodiment of the application, more than one of the protective layer 50, the reflective layer 51, and the cap layer 52 can be omitted. In other words, the structure of the insulating reflective structure 500 comprises any one or two of the protective layer 50, the reflective layer 51 and the cap layer 52.

In an embodiment of the application, the protective layer 50 and/or the cap layer 52 comprises multilayers. Preferably, the cap layer 52 comprises a silicon oxide film in contact with the reflective layer 51 and a silicon nitride film formed on the silicon oxide film.

The insulating reflective structure 500 comprises a first insulating reflective structure opening 501 to expose the first contact electrode 41 and a second insulating reflective structure opening 502 to expose the second contact electrode 42. A first electrode pad 61 covers the first insulating reflective structure opening 501 to contact the first contact electrode 41 and forms an electrical connection with the first semiconductor layer 211. A second electrode pad 62 covers the second insulating reflective structure opening 502 to contact the second contact electrode 42 and forms an electrical connection with the second semiconductor layer 213.

In an embodiment of the application, the first contact electrode 41 and/or the second contact electrode 42 can be omitted. The first insulating reflective structure opening 501 exposes the first semiconductor layer 211 and/or the second insulating reflective structure opening 502 exposes the conductive layer 30. The first electrode pad 61 covers the first insulating reflective structure opening 501 to contact the first semiconductor layer 211, and/or the second electrode pad 62 covers the second insulating reflective structure opening 502 to contact the conductive layer 30.

The first contact electrode 41, the second contact electrode 42, the first electrode pad 61 and/or the second electrode pad 62 comprise a metal material comprising chromium (Cr), titanium (Ti), tungsten (W), gold (Au), aluminum (Al), indium (In), tin (Sn), nickel (Ni), platinum (Pt), silver (Ag) or an alloy of the above materials. The first electrode pad 61 and the second electrode pad 62 comprise single layer or multilayers. For example, the first electrode pad 61 or the second electrode pad 62 comprises Al/Pt stack, Ti/Au stack, Ti/Pt/Au stack, Cr/Au stack, Cr/Pt/Au stack, Ni/Au stack, Ni/Pt/Au stack, Cr/Al/Ti/Pt stack, Ti/Al/Ti/Pt/Ni/Pt stack, Cr/Al/Ti/Al/Ni/Pt/Au stack Cr/Al/Cr/Ni/Au stack or Ag/NiTi/TiW/Pt stack. The first electrode pad 61 and the second electrode pad 62 can be used as an electrical path for an external power source to supply current to the first semiconductor layer 211 and the second semiconductor layer 213. In the embodiment, when the first electrode pad 61 and the second electrode pad 62 comprise multiple layers, the metal structure of the first electrode pad 61 and the second electrode pad 62 connected to the external power source can be formed by alternately stacking gold (Au) and tin (Sn) or tin (Sn) and silver (Ag). The thickness or composition ratio of gold (Au) or silver (Ag) to tin (Sn) is 0.25% to 2.25%. In another embodiment, when the first electrode pad 61 and the second electrode pad 62 comprise gold (Au) and tin (Sn), gold (Au) is used as the outermost metal layer of the first electrode pad 61 and the second electrode pad 62. The first contact electrode 41, the second contact electrode 42, the first electrode pad 61 and/or the second electrode pad 62 comprise a thickness between 1 μm~100 μm, preferably between 1.2 μm~60 μm, and more preferably between 1.5 μm~6 μm. In an embodiment, the tin (Sn) metal layer of the first electrode pad 61 and/or tin (Sn) metal layer of the second electrode pad 62 each comprises a thickness between 3.5 μm and 8.5 μm. In another embodiment, the tin silver (SnAg) metal layer of the first electrode pad 61 and/or the tin silver (SnAg) metal layer of second electrode pad 62 each comprises a thickness between 8 μm~10 μm.

As described above, since the insulating reflective structure 500 covers the uneven structure of the semiconductor stack 20, the first contact electrode 41 and the second contact electrode 42, the height difference between the semiconductor stack 20, the first contact electrode 41 and the second contact electrode 42 affects the film quality of the insulating reflective structure 500. For example, when the insulating reflective structure 500 covers the semiconductor stack 20, at the interface between the side surface of the semiconductor stack 20 and the top surface 100 of the substrate 10, a fracture surface (not shown) is easily formed in the insulating reflective structure 500, and the external moisture tends to invade the semiconductor stack 20 along the fracture surface to reduce the reliability of the device.

In order to avoid the above-mentioned problem of the fracture surface, in the embodiment, by the better film coating characteristics of chemical vapor deposition (CVD), the protective layer 50 and the cap layer 52 are preferably formed by chemical vapor deposition (CVD), more preferably, by plasma enhanced chemical vapor deposition (PECVD).

In an embodiment of the application, the protective layer 50 and/or the cap layer 52 can be formed by atomic layer deposition.

The material of the protective layer 50 comprises silicon oxide, preferably has a thickness between 0.2 μm and 2 μm. If the thickness of the protective layer 50 is less than 0.2 μm, the protective layer 50 cannot cover the first contact electrode 41 and the second contact electrode 42 completely. If the thickness of the protective layer 50 is greater than 2 μm, the process time and the cost are increased when forming the first insulating reflective structure opening 501 and the second insulating reflective structure opening 502.

The material of the cap layer 52 comprises metal oxide, such as $Al_2O_3$; nitride, oxide or oxynitride, such as SiN, $SiO_x$ or $SiO_xN_y$. In an embodiment of the application, the cap layer 52 may be formed of a single layer structure by the above materials or a multilayer structure by a combination of the above materials. The cap layer 52 preferably comprises a thickness between 0.5 μm and 2.5 μm.

The reflective layer 51 is formed between the protective layer 50 and the cap layer 52. The reflective layer 51 comprises two or more materials of different refractive indexes alternately stacked to form a Distributed Bragg Reflector (DBR) structure, which selectively reflects the light of a specific wavelength. For example, layers of $SiO_2/TiO_2$ or $SiO_2/Nb_2O_5$ can be laminated to form an insulating reflective structure with high reflectivity. When $SiO_2/TiO_2$ or $SiO_2/Nb_2O_5$ is provided to form a Distributed Bragg Reflector (DBR) structure, each layer of the Distributed Bragg Reflector (DBR) structure is designed to comprise an optical thickness of one or an integral multiple of a quarter of the wavelength of the light emitted from the active layer 212. The thickness of the Distributed Bragg Reflector (DBR) can have a deviation of ±30% on the basis of one or the integral multiple of λ/4. Since the thickness of each layer of the Distributed Bragg Reflector (DBR) structure affects the reflectivity, it is preferable to use E-beam evaporation to form the reflective layer 51 to stably control the thickness of each layer of the Distributed Bragg Reflector (DBR) structure.

FIG. 1 is a schematic diagram of a wafer on which a plurality of light-emitting devices 1 is formed. When the dicing area 1001 is cut by a laser and/or a knife, the plurality of light-emitting devices 1 formed on the wafer is separated into individual light-emitting devices 1, the physical impact force of the laser and/or knife scribing is likely to generate cracks in the insulating reflective structure 500 at the edge of the light-emitting device 1, especially the reflective layer 51. Moreover, once the crack spreads into the semiconductor stack 20, the external moisture easily penetrates into the semiconductor stack 20 along the crack, thereby reducing the reliability of the device.

In order to solve the above mentioned problems, the light-emitting device 1 comprises a dicing street 10d, which is a part of the dicing area 1001 in the wafer cutting. The dicing street 10d is a preserved area on the light-emitting device 1 after the dicing area 1001 is processed in the wafer cutting. The dicing street 10d is formed between the sidewall 10S of the substrate 10 and a sidewall 20S of the semiconductor stack 20, and the dicing street 10d comprises a width between 0.1 μm~50 μm, preferably less than 30 more preferably less than 15 The dicing street 10d exposes the top surface 100 of the substrate 10 and is located around the light-emitting device 1 to surround the semiconductor stack 20. In the embodiment, the substrate 10 on the dicing street 10d further comprises an inclined surface 101 connected to the top surface 100 of the substrate 10. With respect to the inclined surface 101, the top surface 100 is substantially a horizontal surface. In a top view of the light-emitting device 1, the dicing street 10d comprises a first surface area, the semiconductor stack 20 comprises a second surface area, and a ratio of the first surface area to the second surface area is between 10~50%. In a side view of the light-emitting device 1, as shown in FIG. 2, the insulating reflective structure 500 on the dicing street 10d directly contacts the top surface 100 of the substrate 10.

In an embodiment, in order to reserve more area for the mesa 211a to locate the first electrode pad 61 and the second electrode pad 62, an angle between the sidewall 20S of the semiconductor stack 20 and the top surface 100 of the substrate 10 is between 70 degrees and 110 degrees, preferably between 80 degrees and 100 degrees, and more preferably between 85 degrees and 95 degrees.

In an embodiment, in order to improve the film quality of the reflective layer 51 covering the sidewall 20S of the semiconductor stack 20 and avoid the cracking defect of the reflective layer 51, an angle between the sidewall 20S of the semiconductor stack 20 and the top surface 100 of the substrate 10 is between 10 degrees and 50 degrees, preferably between 20 degrees and 40 degrees, and more preferably between 25 degrees and 35 degrees. In another embodiment, the sidewall 20S comprises inclined surfaces with different slopes. The inclined surface closer to the top surface 100 of the substrate 10 is steeper than the inclined surface away from the top surface 100 of the substrate 10. For example, an angle between the inclined surface directly contacting the top surface 100 of the substrate 10 and the top surface 100 of the substrate 10 is between 50 degrees and 70 degrees. An angle between the inclined surface away from the top surface 100 of the substrate 10 and a horizontal plane parallel to the top surface 100 is between 30 degrees and 50 degrees.

In the embodiment, as shown in FIG. 2, the protective layer 50 covers the inclined surface 101 of the substrate 10. The reflective layer 51 comprises an uneven portion 511. The uneven portion 511 completely or partially covers the inclined surface 101 of the substrate 10. The uneven portion 511 comprises a plurality of layers, and the end of one of the plurality of layers comprises a wedge shape. The end of one of the plurality of layers comprises a thickness gradually decreases in a direction toward the substrate 10. One end of the protective layer 50 and/or the cap layer 52 comprises a wedge shape, and a thickness of the one end of the protective layer 50 and/or the cap layer 52 gradually decreases in a direction toward the substrate 10.

Figure 3:
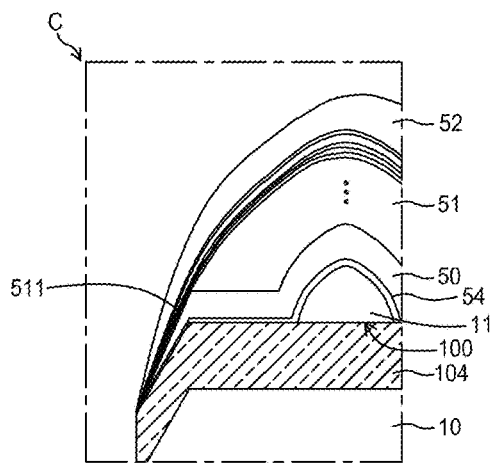
FIG. 3 illustrates a partial cross-sectional view of a position C of the light-emitting device 1 illustrated in FIG. 1.
Figure 4:
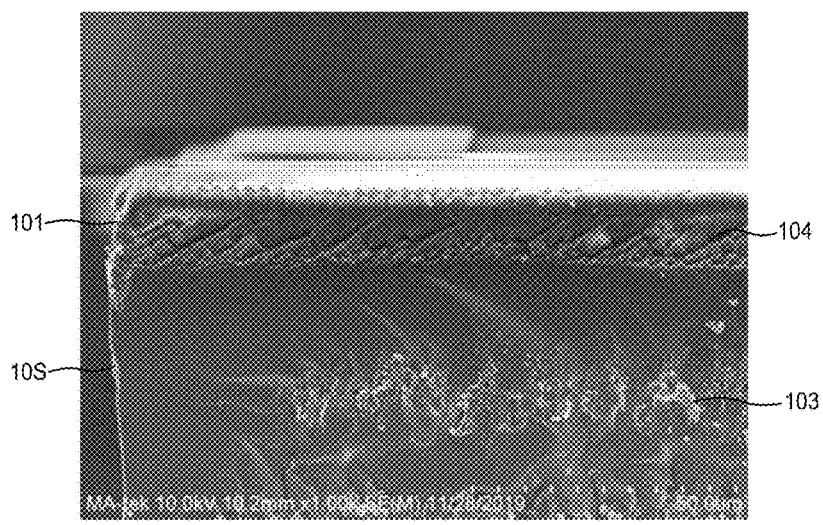
FIG. 4 illustrates an SEM photograph of the position C of the light-emitting device 1 illustrated in FIG. 1.

FIG. 3 illustrates a partial cross-sectional view of a position C of the light-emitting device 1 illustrated in FIG. 1. FIG. 4 illustrates an SEM photograph of the position C of the light-emitting device 1 illustrated in FIG. 1 and FIG. 3. As shown in FIG. 2, FIG. 3 and FIG. 4, the substrate comprises a first rough portion 103 formed on the plurality of sidewalls 10S of the substrate 10. The substrate 10 optionally comprises a second rough portion 104 formed on the inclined surface 101 of the substrate 10, which is away from the first rough portion 103.

In an embodiment of the application shown in FIG. 2 and FIG. 3, before forming the insulating reflective structure 500, a compact layer 54 is formed on the top surface 100 of the substrate 10 and the surface 20ts of the semiconductor stack 20 by atomic layer deposition to directly cover the top surface 100 of the substrate 10 and the surface 20ts of the semiconductor stack 20. The material of the compact layer 54 comprises silicon oxide, aluminum oxide, hafnium oxide, zirconium oxide, yttrium oxide, lanthanum oxide, tantalum oxide, silicon nitride, aluminum nitride, or silicon oxynitride. In an embodiment, an interface between the compact layer 54 and the semiconductor stack 20 comprises a metal element and oxygen, and the metal element comprises aluminum, hafnium, zirconium, yttrium, lanthanum, or tantalum. The compact layer 54 comprises a thickness between 400 Å and 2000 Å, preferably between 800 Å and 1600 Å, and more preferably between 1000 Å and 1400 Å.

The film formed by atomic layer deposition has good step coverage, thickness uniformity and higher density. With these characteristics, a pinhole-free compact layer 54 is conformally formed on the substrate 10 and the semiconductor stack 20. The compact layer 54 formed by atomic layer deposition prevents the moisture from penetrating into the semiconductor stack 20 along the gap between the substrate 10 and the semiconductor stack 20 or the void on the surface 20ts of the semiconductor stack 20.

In an embodiment of the application (not shown), the compact layer 54 and the protective layer 50 are stacked in pairs for multiple times, and then the protective layer 50 is provided to be connected to the reflective layer 51.

Figure 5A:
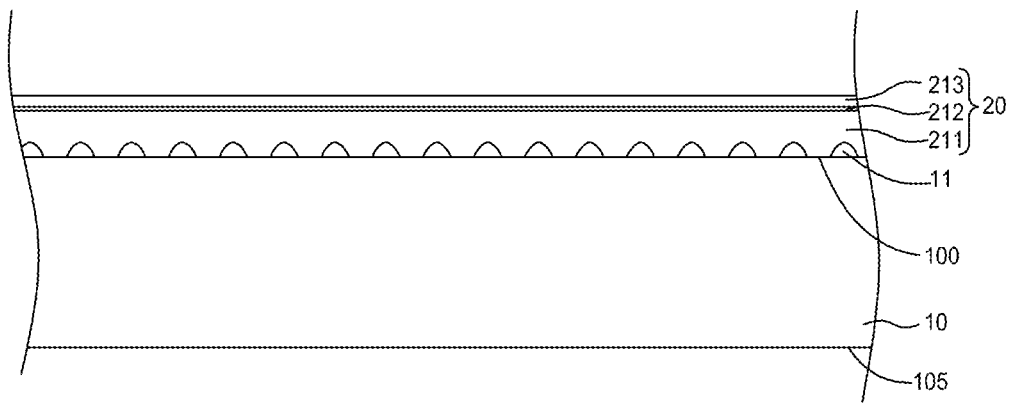
FIGS. 5A-5F illustrate a manufacturing method of the light-emitting device 1 in accordance with an embodiment of the present application.

FIG. 5A to FIG. 5F illustrate a manufacturing method of the light-emitting device 1 disclosed in an embodiment of the present application. In the following, for convenience of description, FIGS. 5A-5F are illustrated by the structure taken along the line A-A' of FIG. 1 and the position D, and some figures are omitted as appropriate. As shown in FIG. 5A, a substrate 10 is provided, which comprises a top surface 100, a bottom surface 105, and a plurality of protrusions 11 protruding from the top surface 100. The buffer layer (not shown) and the semiconductor stack 20 are formed on the substrate 10, wherein the semiconductor stack 20 comprises a first semiconductor layer 211, a second semiconductor layer 213, and an active layer 212 formed between the first semiconductor layer 211 and the second semiconductor layer 213.

Figure 5B:
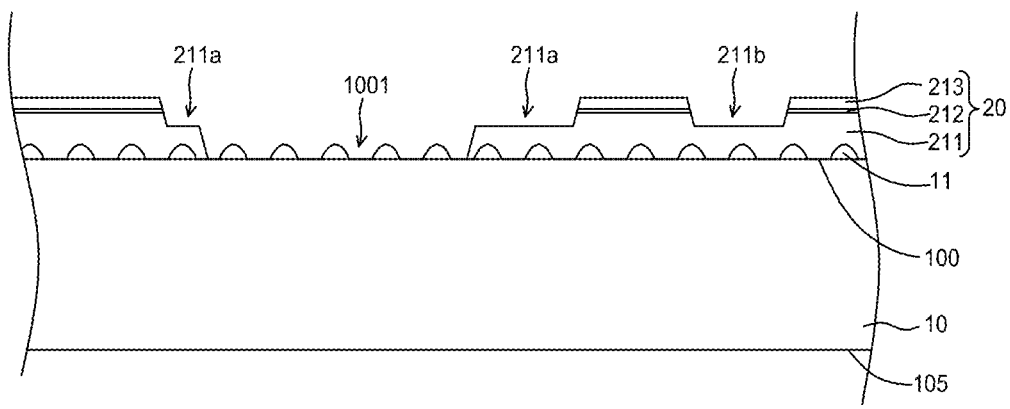

As shown in FIG. 5B, portions of the first semiconductor layer 211, the second semiconductor layer 213 and the active layer 212 around the periphery of the semiconductor stack 20 are etched away to form a mesa 211a and a first electrical contact region 211b to expose the first semiconductor layer 211 and a dicing area 1001 to expose the substrate 10. In the embodiment, in the top view, as shown in FIG. 1, the dicing areas 1001 divide the semiconductor stack 20 into a plurality of light emitting areas. The mesa 211a continuously surrounds the periphery of the semiconductor stack 20 of each plurality of light-emitting areas and is approximately a quadrilateral shape. In order to separate the plurality of light-emitting areas to form an individual light-emitting device, the dicing area 1001 requires a certain width to ensure that the light-emitting device is not damaged while reserving sufficient light-emitting areas, preferably between 1 μm~150 μm, more preferably between 5 μm~50 μm.

Figure 5C:
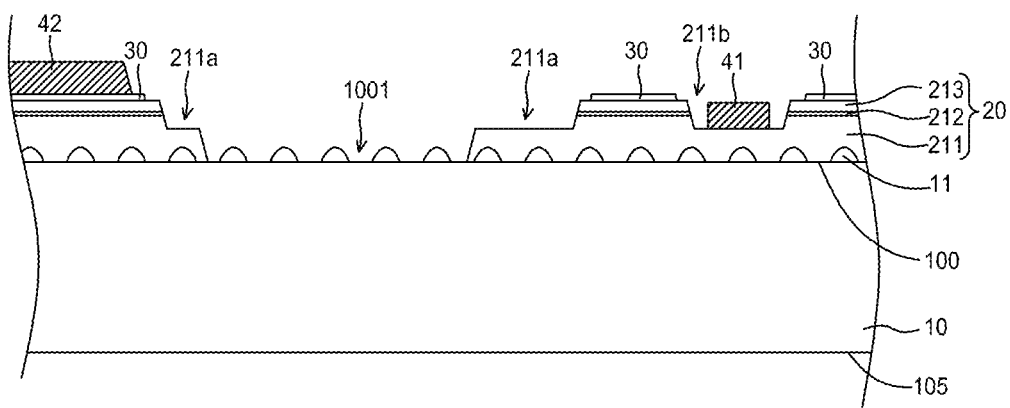

As shown in FIG. 5C, the first contact electrode 41 is formed on the first electrical contact region 211b. The conductive layer 30 and/or the second contact electrode 42 are formed on the second semiconductor layer 213.

Figure 5D:
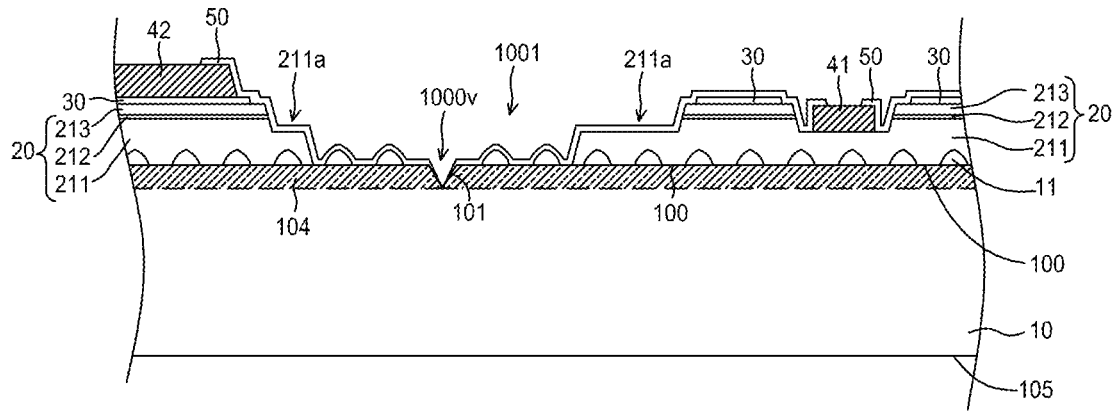

As shown in FIG. 5D, a concave portion 1000v comprising an inclined surface 101 is formed on the dicing area 1001 of the substrate 10 by the laser scribing and/or the etching process. In the side view, the concave portion 1000v comprises a triangle, a polygon, or an irregular shape. In an embodiment, the step of forming the concave portion 1000v with the inclined surface 101 on the substrate 10 of the dicing area 1001 by the laser scribing and/or etching process can be processed before the forming step of the first contact electrode 41 and the second contact electrode 42.

In an embodiment of the application, the insulating reflective structure 500 is formed before forming of concave portion 1000v. When the substrate 10 is a sapphire substrate, a laser having a wavelength in the UV range, for example, 266 nm, 343 nm, or 355 nm, is used to scribe and melt the insulating reflective structure 500 and the substrate 10 on the dicing area 1001 to form the concave portion 1000v having the inclined surface 101. The substrate 10 after being melted comprises residues, and the residues comprise aluminum (Al), oxygen (O), silicon (Si), titanium (Ti), and/or carbon (C). In an embodiment, the residue adheres to the inclined surface 101. In the embodiment, the inclined surface 101 melted by the laser comprises a rough surface. In an embodiment of forming the concave portion 1000v by laser scribing, the second rough portion 104 is formed on the inclined surface 101 of the substrate 10. In an embodiment, the residue adheres to the inclined surface 101 comprising the second rough portion 104.

In an embodiment of the application, the etching process can be provided by wet etching, and the etching solution comprises hydrochloric acid (HCl), nitric acid (HNO$_3$), potassium hydroxide (KOH), sulfuric acid (H$_2$SO$_4$), phosphoric acid (H$_3$PO$_4$) or a combination of the above solutions. The temperature of the etching process is about 200~300° C. In another embodiment of the application, the etching process can be provided by dry etching, such as plasma etching, excited state ion etching, inductively coupled plasma etching, or enhanced capacitively coupled plasma etching. In an embodiment of forming the concave portion 1000v by etching, the second rough portion 104 is formed on the inclined surface 101 of the substrate 10.

Next, the protective layer 50 is formed on the semiconductor stack 20, the dicing area 1001, and the concave portion 1000v. The material of the protective layer 50 comprises aluminum oxide (Al$_2$O$_3$), silicon nitride (SiN$_x$), silicon oxide (SiO$_x$) or silicon oxynitride (SiO$_x$N$_y$). The protective layer 50 preferably comprises a thickness between 0.2 μm and 2 μm. If the thickness of the protective layer 50 is less than 0.2 μm, it is not enough to cover a height difference on the structure of the semiconductor stack 20 and the concave portion 1000v completely. If the thickness of the protective layer 50 is greater than 2 μm, the time for the subsequent patterning and etching process may be increased. Chemical vapor deposition (CVD) is easier to cover structures with height differences than E-beam evaporation or physical vapor deposition. In order to cover the structure with height difference on the semiconductor stack 20 and the concave portion 1000v completely, the protective layer 50 is preferably formed by the chemical vapor deposition, more preferably formed by plasma enhanced chemical vapor deposition (PECVD).

Figure 5E:
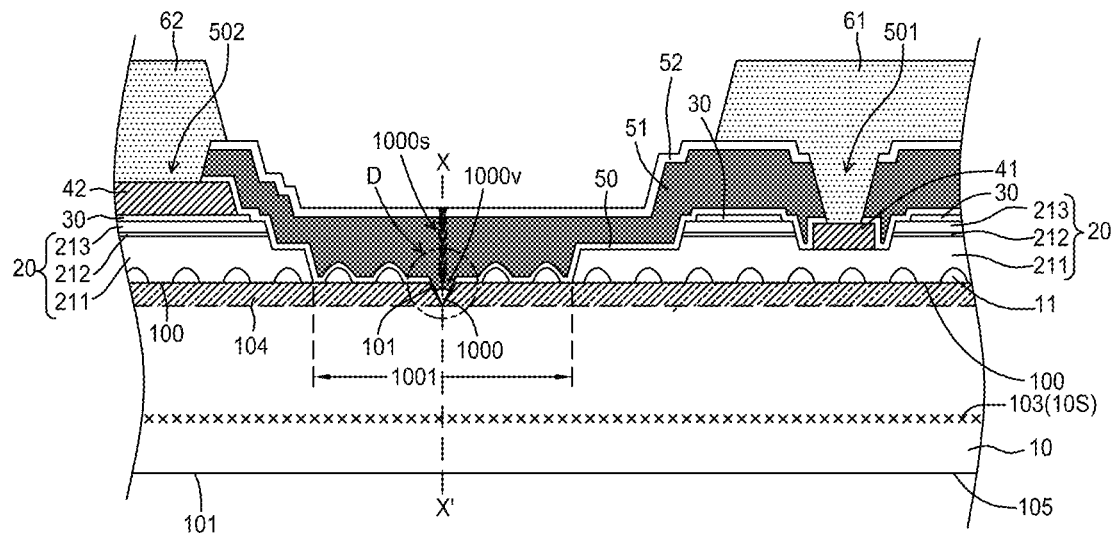

As shown in FIG. 5E, the reflective layer 51 is formed on the protective layer 50. In the embodiment, the reflective layer 51 comprises two or more materials of different refractive indexes alternately stacked to form a Distributed Bragg Reflector (DBR) structure, which selectively reflects the light of a specific wavelength. For example, layers of SiO$_2$/TiO$_2$ or SiO$_2$/Nb$_2$O$_5$ are laminated to form an insulating reflective structure with high reflectivity. When SiO$_2$/TiO$_2$ or SiO$_2$/Nb$_2$O$_5$ forms the Distributed Bragg Reflector (DBR) structure, at least one layer of the Distributed Bragg Reflector (DBR) structure is designed to have an optical thickness of one or an integral multiple of a quarter of the specific wavelength, greater than one or an integral multiple of a quarter of the specific wavelength, or less than one or an integral multiple of a quarter of the specific wavelength, and the pairs of SiO$_2$/TiO$_2$ or SiO$_2$/Nb$_2$O$_5$ is preferably between 4~30. If the pairs of SiO$_2$/TiO$_2$ or SiO$_2$/Nb$_2$O$_5$ are less than this range, the reflectivity of the Distributed Bragg Reflector (DBR) structure is poor; if the pairs of SiO$_2$/TiO$_2$ or $SiO_2/Nb_2O_5$ are greater than this range, the thickness of the Distributed Bragg Reflector (DBR) structure is too thick. In order to accurately control the thickness of each layer of the Distributed Bragg Reflector (DBR) structure, preferably, the reflective layer 51 is formed by E-beam evaporation. In an embodiment of the application, the reflective layer 51 preferably comprises a thickness between 1 μm and 6 μm, and more preferably has a thickness between 2 μm and 4 μm, such as 3.5 μm.

As shown in FIG. 5E, because E-beam evaporation forms film with poor coverage for structures with height differences, when the reflective layer 51 is formed on the dicing area 1001 by E-beam evaporation, the reflective layer 51 cannot cover the concave portion 1000v completely, thus a void 1000 is formed in the concave portion 1000v and a blocking surface 1000s along the cross section of the line X-X' is formed in the reflective layer 51 above the void 1000.

In order to protect the Distributed Bragg Reflector (DBR) structure of the reflective layer 51 and increase the reflectivity of the Distributed Bragg Reflector (DBR) structure, the cap layer 52 is formed on the reflective layer 51. In order to increase the reflectivity, the thickness of the cap layer 52 is preferably greater than 0.5 μm. More preferably, the thickness of the cap layer 52 is between 0.1~2.5 μm, preferably between 0.2~2 μm, more preferably between 0.5~1.5 μm. In order to cover the surface of the reflective layer 51 completely, the cap layer 52 is preferably formed by chemical vapor deposition, more preferably formed by plasma enhanced chemical vapor deposition (PECVD).

When the plurality of light-emitting devices formed on a wafer is separated into individual light-emitting devices, the laser and/or the knife can be used for scribing, or a chemical etching process can be singly used to complete or simultaneously used with the laser and/or the knife. When the laser is used to scribe the wafer, the invisible laser dicing can be used to scribe the wafer from an interior of the substrate 10, thereby avoiding the problems of chipping and the loss of the semiconductor material. For example, along the incident direction of the bottom surface 105 of the substrate 10, the focus point of the laser is between the top surface 100 and the bottom surface 105 of the substrate 10, and a plurality of damaged areas is formed in the substrate 10 along the plurality of dicing areas 1001, but the top surface 100 and the bottom surface 105 of the substrate 10 are not damaged. Then, applying a physical force along the plurality of damaged areas and forming a cleavage surface on an extension direction between the top surface 100 and the bottom surface 105 of the substrate 10. The extended cleavage surface and the blocking surface 1000s of the reflective layer 51 separate the plurality of light-emitting devices 1 on the wafer into individual light-emitting devices 1. On the sidewall 10S of the light-emitting device after separation, the plurality of damaged areas constitutes the first rough portion 103. Compared with directly scribing with the knife, the invisible laser dicing reduces the width required by the dicing street.

As shown in FIG. 5E, the first insulating reflective structure opening 501 and the second insulating reflective structure openings 502 are formed on the protective layer 50, the reflective layer 51, and the cap layer 52 by lithography and etching processes to expose the first contact electrode 41 and the second contact electrode 42. Following, a first electrode pad 61 is formed on the first insulating reflective structure opening 501 and a second electrode pad 62 is formed on the second insulating reflective structure opening 502.

Figure 6:
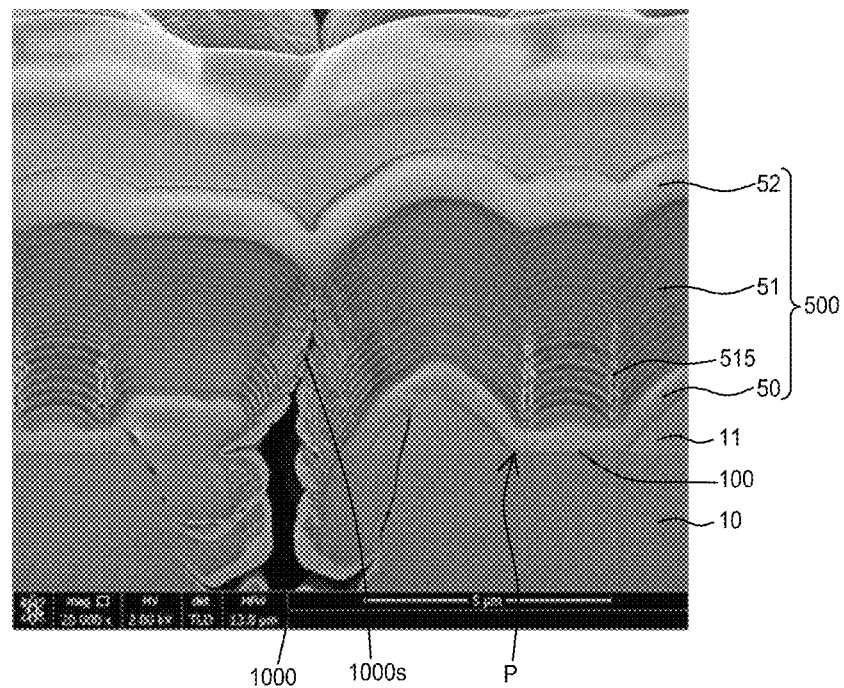
FIG. 6 illustrates an SEM photograph of a position D illustrated in FIG. 1.

FIG. 6 is an SEM photograph of the structure illustrated in position D of FIG. 1 and the structure of FIG. 5E. As shown in FIG. 6, the substrate comprises one or a plurality of protrusions 11 protruding from the top surface 100 of the substrate 10. The insulating reflective structure 500 comprises a protective layer 50, a reflective layer 51 and a cap layer 52. The protective layer 50, the reflective layer 51 and/or the cap layer 52 comprises a surface topography corresponding to that of the plurality of protrusions 11 of the substrate 10. Because the height difference of the protrusion 11 and the top surface 100 of the substrate 10, the protective layer 50, the reflective layer 51 and/or the cap layer 52 comprises a fracture portion 515 corresponding to a position adjacent to a connecting portion P between the protrusion 11 and the top surface 100 of the substrate 10.

Figure 5F:
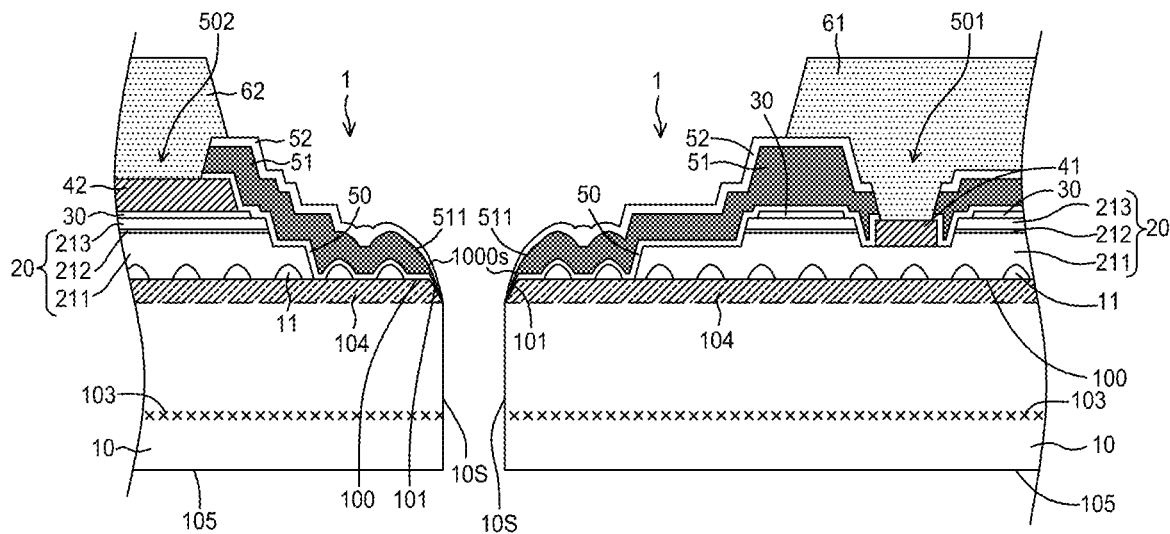

As shown in FIG. 5E, along the damaged area of the substrate 10, such as the first rough portion 103 and the blocking surface 1000s of the reflective layer 51 along the line X-X', the physical force is applied to cut the substrate 10 and the insulating reflective structure 500 to form the plurality of light-emitting devices 1 illustrated in FIG. 5F. As shown in FIG. 5F, the protective layer 50 covers the inclined surface 101 of the substrate 10. The reflective layer 51 comprises the uneven portion 511. The uneven portion 511 completely or partially covers the inclined surface 101 of the substrate 10. The uneven portion 511 comprises a plurality of layers, and an end of one of the plurality of layers comprises a wedge shape. The end of one of the plurality of layers comprises a thickness gradually decreases in a direction toward the substrate 10. One end of the protective layer 50 and/or the cap layer 52 comprises a wedge shape and the thickness of the end of the protective layer 50 and/or the cap layer 52 gradually decreases in one direction toward the substrate 10.

Figure 7:
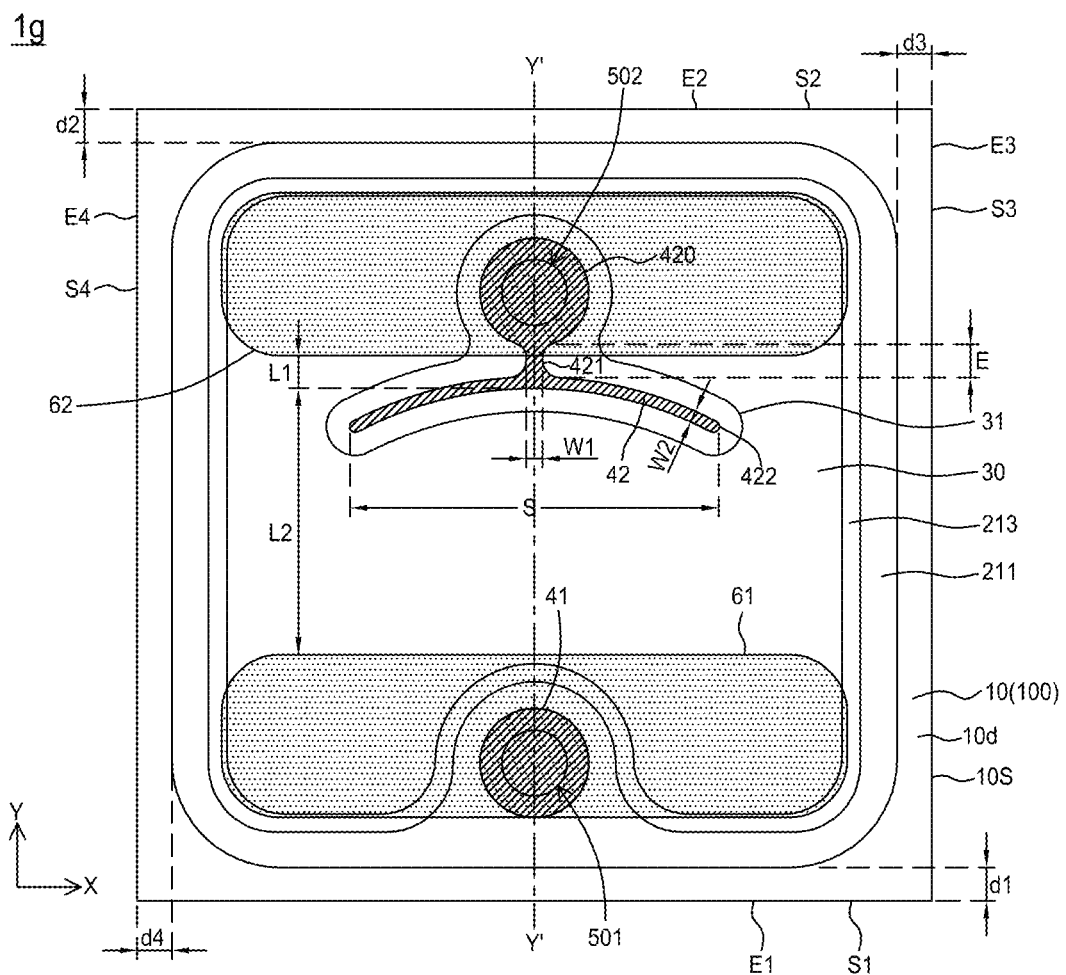
FIG. 7 illustrates a top view of a light-emitting device 1g in accordance with an embodiment of the present application.
Figure 8:
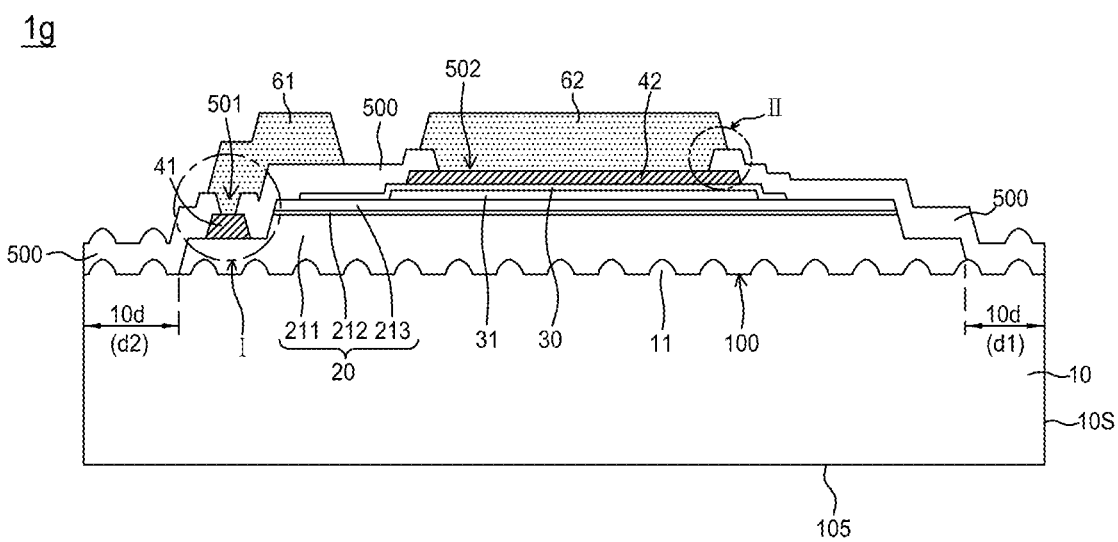
FIG. 8 illustrates a cross-sectional view of the light-emitting device 1g taken along line Y-Y' of FIG. 7.

FIG. 7 illustrates a top view of a light-emitting device 1g in accordance with an embodiment of the present application. FIG. 8 illustrates a cross-sectional view of the light-emitting device 1g taken along line Y-Y' of FIG. 7. The light-emitting device 1g and the light-emitting device 1 illustrated in FIG. 1~FIG. 6 have substantially the same structure. Therefore, the light-emitting device 1g and the light-emitting device 1 in FIGS. 1~6 have the same structure with the same name and reference number. The structure, the same material, or the same function is omitted here or not repeated here.

A light-emitting device 1g comprises a substrate 10 comprising a top surface 100 and a sidewall 10S; a semiconductor stack 20 formed on the top surface 100 of the substrate 10, comprising a first semiconductor layer 211, an active layer 212, and a second semiconductor layer 213; a dicing street 10d surrounding the semiconductor stack 20 and exposing the top surface 100 of the substrate 10; a conductive layer 30 formed on the second semiconductor layer 213; a current blocking layer 31 formed between the conductive layer 30 and the second semiconductor layer 213; an insulating reflective structure 500 covering the semiconductor stack 20 and the dicing street 10d comprising a first insulating reflective structure opening 501 and a second insulating reflective structure opening 502; a first electrode pad 61 covering the first insulating reflective structure opening 501 to electrically connect to the first semiconductor layer 211; and a second electrode pad 62 covering the second insulating reflective structure opening 502 to electrically connect to the second semiconductor layer 213.

The light-emitting device 1g can be a square as shown in FIG. 7 or a rectangle with one long side and one short side.

Any side of the light-emitting device 1g is at least greater than 50 μm, but not more than 260 μm. In an embodiment, when the longest side of the light-emitting device 1g is less than 200 μm, the distance between the first electrode pad 61 and the second electrode pad 62 is at least larger than 10 μm but not more than 45 μm. In an embodiment, when the longest side of the light-emitting device 1g is greater than 200 μm, the distance between the first electrode pad 61 and the second electrode pad 62 is at least larger than 50 μm but not more than 150 μm.

In an embodiment, when the longest side of the light-emitting device 1g is larger than 200 μm, the light-emitting device 1g further comprises a first contact electrode 41 formed on the first semiconductor layer 211, and a second contact electrode 42 formed on the conductive layer 30. In an embodiment, when the longest side of the light-emitting device 1g is less than 200 μm, the light-emitting device 1g does not comprise the first contact electrode 41 and the second contact electrode 42.

The second contact electrode 42 comprises a second contact portion 420, a second connecting portion 421, and one or more second extension portions 422 extending away the second contact portion 420 from the second connecting portion 421. A width W1 of the second connecting portion 421 is larger than or equal to a width W2 of the second extension portion 422. The ends of the plurality of second extension portions 422 are separated by a shortest distance S.

A ratio of a length E of the second connecting portion 421 to the shortest distance S is 0.05 to 0.12. In the top view of the light-emitting device 1g, the shortest distance L1 between the second connecting portion 421 and the second electrode pad 62 can be less than or equal to the shortest distance L2 between the second connecting portion 421 and the first electrode pad 61.

The thickness of the light-emitting device 1g can be between 50 μm and 110 μm, preferably between 70 μm and 90 μm. As shown in FIG. 7, the substrate width d3 or d4 exposed in the lateral direction (X axis) and the exposed substrate width d1 or d2 exposed in the longitudinal direction (Y axis) can be the same or different. The exposed substrate width d1, d2, d3 or d4 is at least larger than 4 μm, but not more than 10 μm.

Figure 9B:
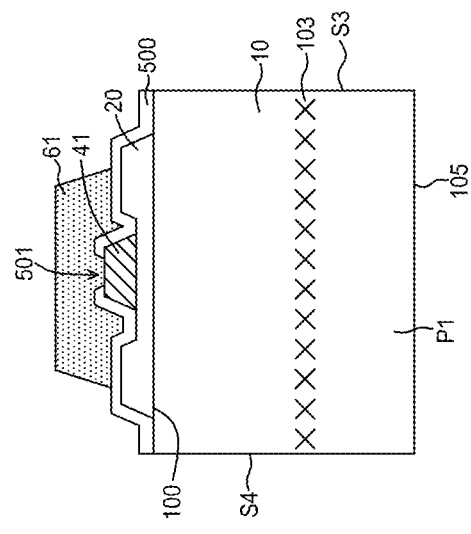
FIG. 9B illustrates a side view of the light-emitting device 1g viewed from the Y axis in FIG. 7 in accordance with an embodiment of the present application.
Figure 9D:
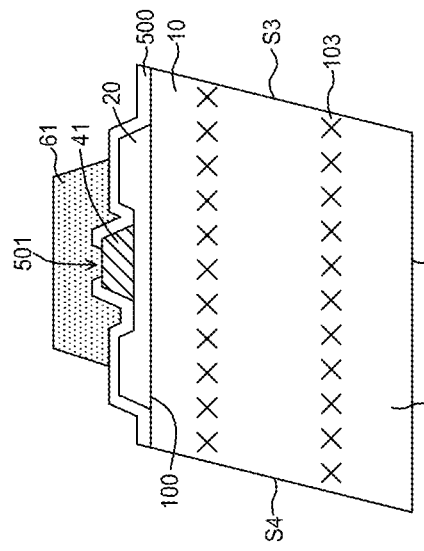
FIG. 9D illustrates a side view of the light-emitting device 1g viewed from the Y axis in FIG. 7 in accordance with another embodiment of the present application.
Figure 9A:
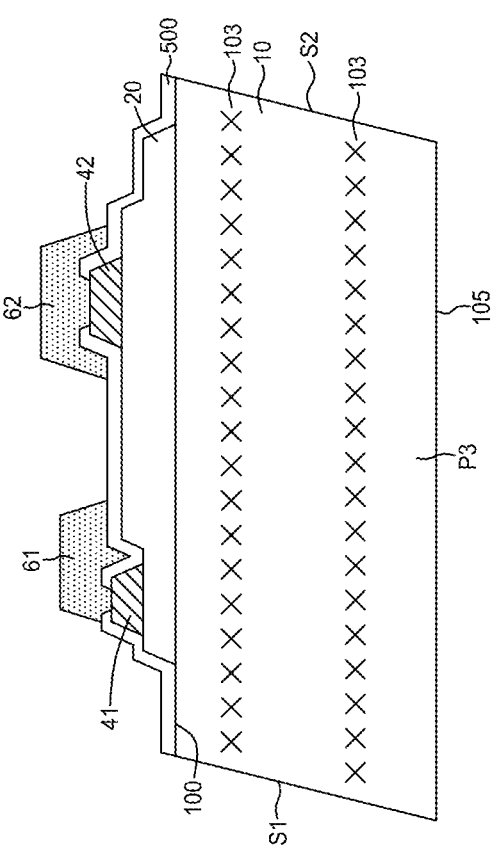
FIG. 9A illustrates a side view of the light-emitting device 1g viewed from the X axis in FIG. 7 in accordance with an embodiment of the present application.

FIG. 9A illustrates a side view of the light-emitting device 1g viewed from the X axis in FIG. 7 in accordance with an embodiment of the present application. FIG. 9B illustrates a side view of the light-emitting device 1g viewed from the Y axis in FIG. 7 in accordance with an embodiment of the present application. In an embodiment, as shown in FIG. 7 and FIG. 9A, the first electrode pad 61 and the second electrode pad 62 are respectively close to the first side E1 and the second side E2 of the light-emitting device 1g. Viewing from the third side E3 or the fourth side E4 of the light-emitting device 1g, the two sides S1 and S2 of the side surface P3 of the substrate 10 are inclined with respect to the bottom surface 105 of the substrate 10. As shown in FIG. 7 and FIG. 9B, viewing from the first side E1 or the second side E2 of the light-emitting device 1g, the two sides S3 and S4 of the side surface P1 of the substrate 10 are substantially perpendicular to the bottom surface 105 of the substrate 10. The lattice plane of the side surface P1 can be R plane, and the lattice plane of the side surface P3 can be M plane or A plane. The exposed substrate width d1 or d2 is greater than the exposed substrate width d3 or d4. Since R plane is a surface that is relatively easy to crack, the side surface P1 comprises one first rough portion 103. Since M plane or A plane is a surface that is relatively hard to crack, the side surface P3 comprises a plurality of first rough portions 103. In that case, the cutting yield is improved by multiple invisible laser cutting at different depths, and a plurality of first rough portions 103 is formed corresponding to the multiple invisible laser cutting at different depths.

Figure 9C:
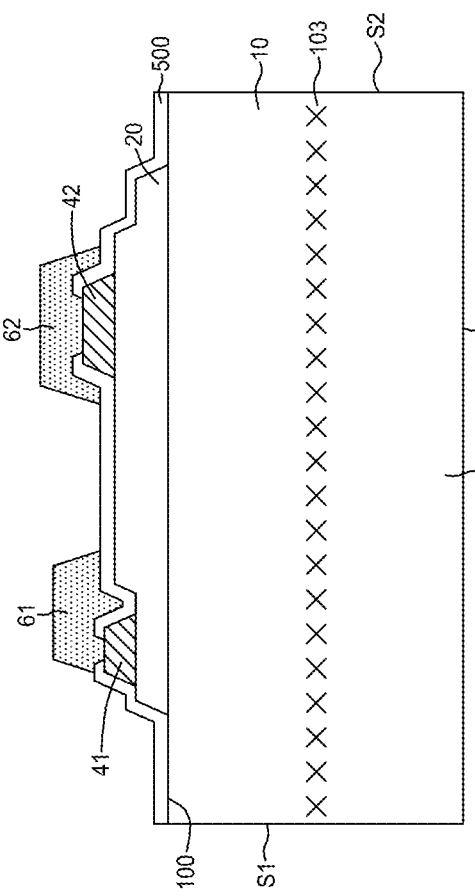
FIG. 9C illustrates a side view of the light-emitting device 1g viewed from the X axis in FIG. 7 in accordance with another embodiment of the present application.

FIG. 9C illustrates a side view of the light-emitting device 1g viewed from the X axis in FIG. 7 in accordance with another embodiment of the present application. FIG. 9D illustrates a side view of the light-emitting device 1g viewed from the Y axis in FIG. 7 in accordance with another embodiment of the present application. In another embodiment, as shown in FIG. 7 and FIG. 9C, viewing from the third side E3 or the fourth side E4 of the light-emitting device 1g, the sides S1 and S2 of the side surface P3 of the substrate 10 are substantially perpendicular to the bottom surface 105 of the substrate 10. As shown in FIG. 7 and FIG. 9D, viewing from the first side E1 or the second side E2 of the light-emitting device 1g, the sides S3 and S4 of the side surface P1 of the substrate 10 are inclined with respect to the bottom surface 105 of the substrate 10. The lattice plane of the side surface P1 can be M plane or A plane, and the lattice plane of the side surface P3 can be R plane. The exposed substrate width d1 or d2 is smaller than the exposed substrate width d3 or d4. Since R plane is a surface that is relatively easy to crack, the side surface P3 comprises one first rough portion 103. Since M plane or A plane is a surface that is relatively hard to crack, the side surface P1 comprises a plurality of first rough portions 103.

In an embodiment of the application, when the third side E3 is the longer side and the first side E1 is the shorter side, a ratio of a length of the longer side to that of the shorter side of the light-emitting device 1g is larger than 2, the exposed lattice plane of the third side E3 of the substrate 10 is R plane, and the exposed lattice plane of the first side E1 of the substrate 10 is M plane or A plane.

Figure 10:
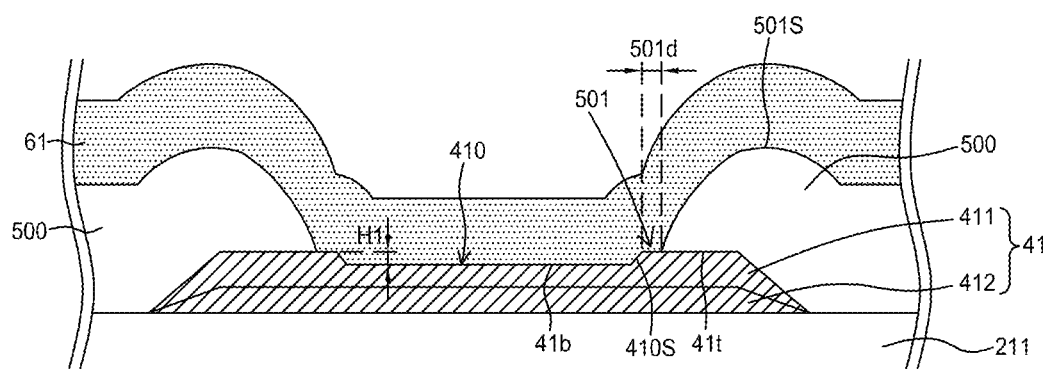
FIG. 10 is a partial cross-sectional view of position I of the light-emitting device 1g in FIG. 8.
Figure 11:
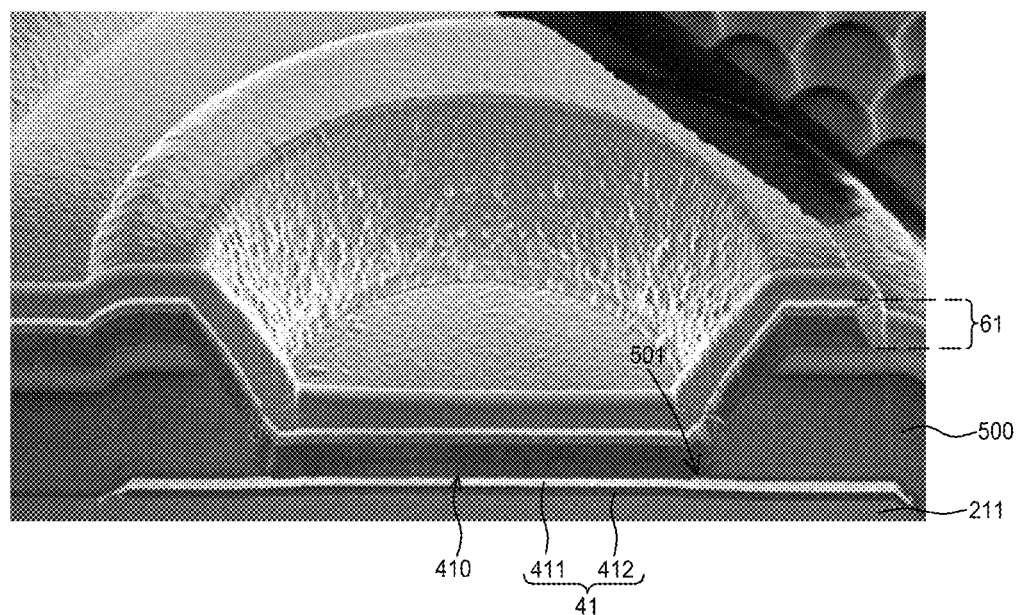
FIG. 11 is an SEM photograph of position I of the light-emitting device 1g in FIG. 8.

FIG. 10 is a partial cross-sectional view of position I of the light-emitting device 1g in FIG. 8. FIG. 11 is an SEM photograph of position I of the light-emitting device 1g in FIG. 8. In order to improve the adhesion of the insulating reflective structure 500, such as the adhesion between the SiO₂ film and the first contact electrode 41, the first contact electrode 41 comprises a first bonding layer 411 and a first conductive layer 412. When the first insulating reflective structure opening 501 is formed by etching, part of the first contact electrode 41 is removed to form a first recess 410. In an embodiment, the first recess 410 is formed in the first bonding layer 411. A step difference H1 is between a bottom 41b of the first recess 410 and a top 41t of the first contact electrode 41. The step difference H1 is between 20 nm and 200 nm, preferably between 50 nm and 150 nm, and more preferably between 80 nm and 100 nm. A sidewall 501S of the insulating reflective structure 500 and a sidewall 410S of the first recess 410 can be continuously connected or separated with a minimum distance 501d. The minimum distance 501d is between 5 nm and 100 nm, preferably between 10 nm and 50 nm, and more preferably between 20 nm and 30 nm.

Figure 12:
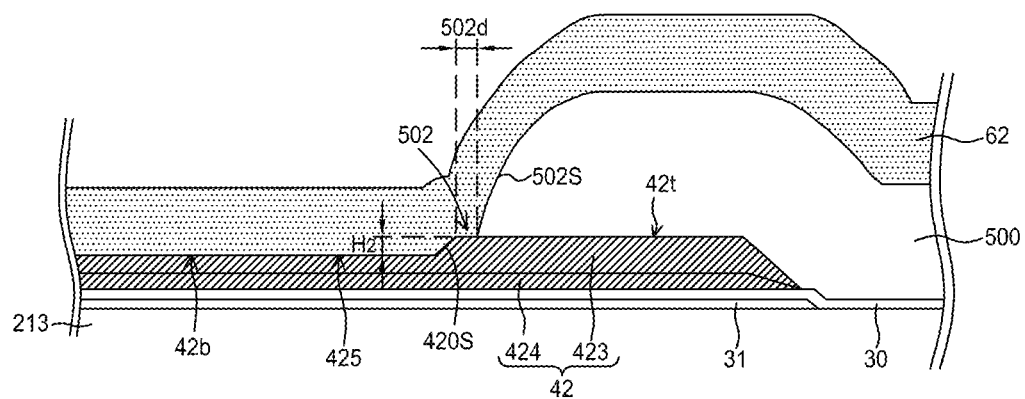
FIG. 12 is a partial cross-sectional view of position II of the light-emitting device 1g in FIG. 8.
Figure 13:
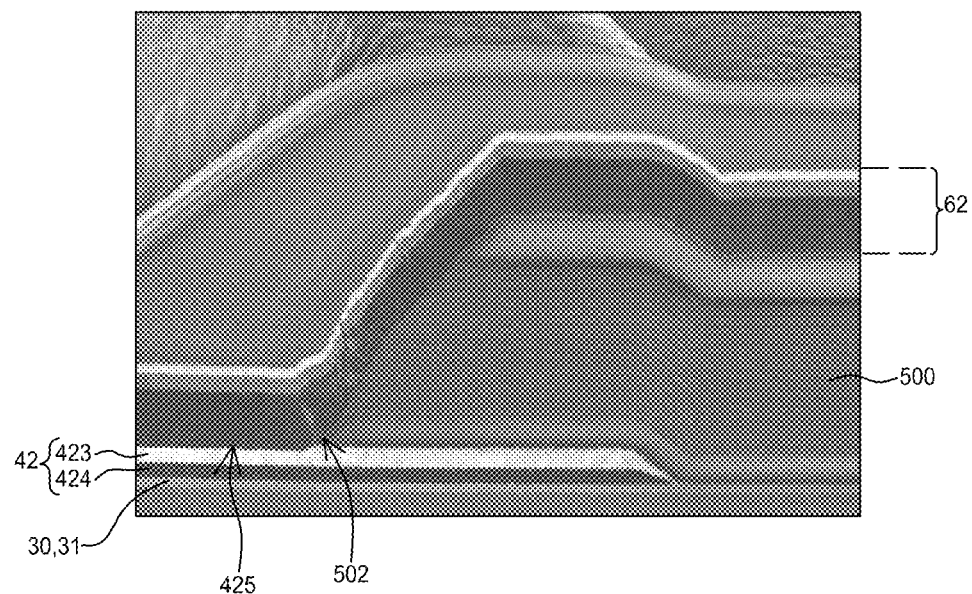
FIG. 13 is an SEM photograph of position II of the light-emitting device 1g in FIG. 8.

FIG. 12 is a partial cross-sectional view of position II of the light-emitting device 1g in FIG. 8. FIG. 13 is an SEM photograph of position II of the light-emitting device 1g in FIG. 8. In order to improve the adhesion of the insulating reflective structure 500, such as the adhesion between the SiO₂ film and the second contact electrode 42, the second contact electrode 42 comprises a second bonding layer 423 and a second conductive layer 424. When the second insulating reflective structure opening 502 is formed by etching, part of the second contact electrode 42 is removed to form a second recess 425. In an embodiment, the second recess 425 is formed in the second bonding layer 423. A first step difference H2 id formed between a bottom 42b of the second recess 425 and a top 42t of the second contact electrode 42. The step difference H2 is between 20 nm and 200 nm, preferably between 50 nm and 150 nm, and more preferably between 80 nm and 100 nm. A sidewall 502S of the insulating reflective structure 500 and a sidewall 420S of the second recess 425 may be continuously connected or separated with a minimum distance 502d. The minimum distance 502d is between 5 nm and 100 nm, preferably between 10 nm and 50 nm, and more preferably between 20 nm and 30 nm.

The first bonding layer 411 and the second bonding layer 423 comprise metals such as titanium (Ti), gold (Au), nickel (Ni), platinum (Pt), or alloys of the foregoing materials. The first conductive layer 412 and the second conductive layer 424 comprise metals such as chromium (Cr), titanium (Ti), tungsten (W), gold (Au), aluminum (Al), indium (In), tin (Sn), platinum (Pt), nickel (Ni), silver (Ag), or alloys of the above materials.

Figure 14:
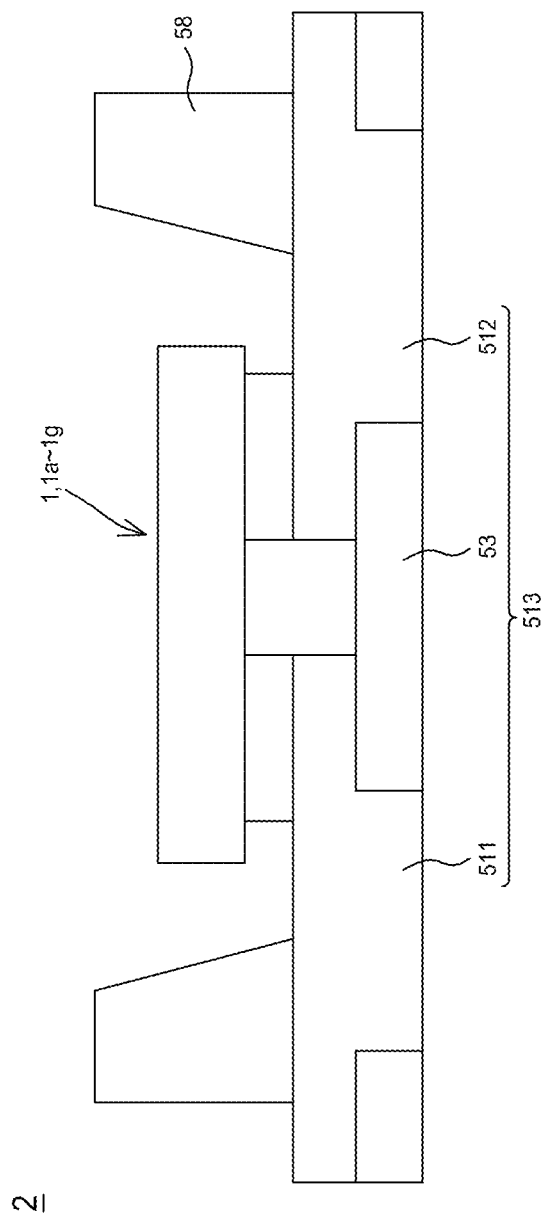
FIG. 14 illustrates a schematic view of a light-emitting apparatus 2 in accordance with an embodiment of the present application.

FIG. 14 is a schematic view of a light-emitting apparatus 2 in accordance with an embodiment of the present application. One of the light-emitting device 1 or 1g in the foregoing embodiment is mounted on the first spacer 511 and the second spacer 512 of the package substrate 513 in the form of flip chip. The first spacer 511 and the second spacer 512 are electrically insulated from each other by an insulating portion 53 comprising an insulating material. The main light-extraction surface of the flip chip is one side of the growth substrate opposite to the electrode-forming surface where the electrodes are formed on. A reflective structure 58 can be provided around the light-emitting device 1 or 1g to increase the light extraction efficiency of the light-emitting apparatus 2.

Figure 15:
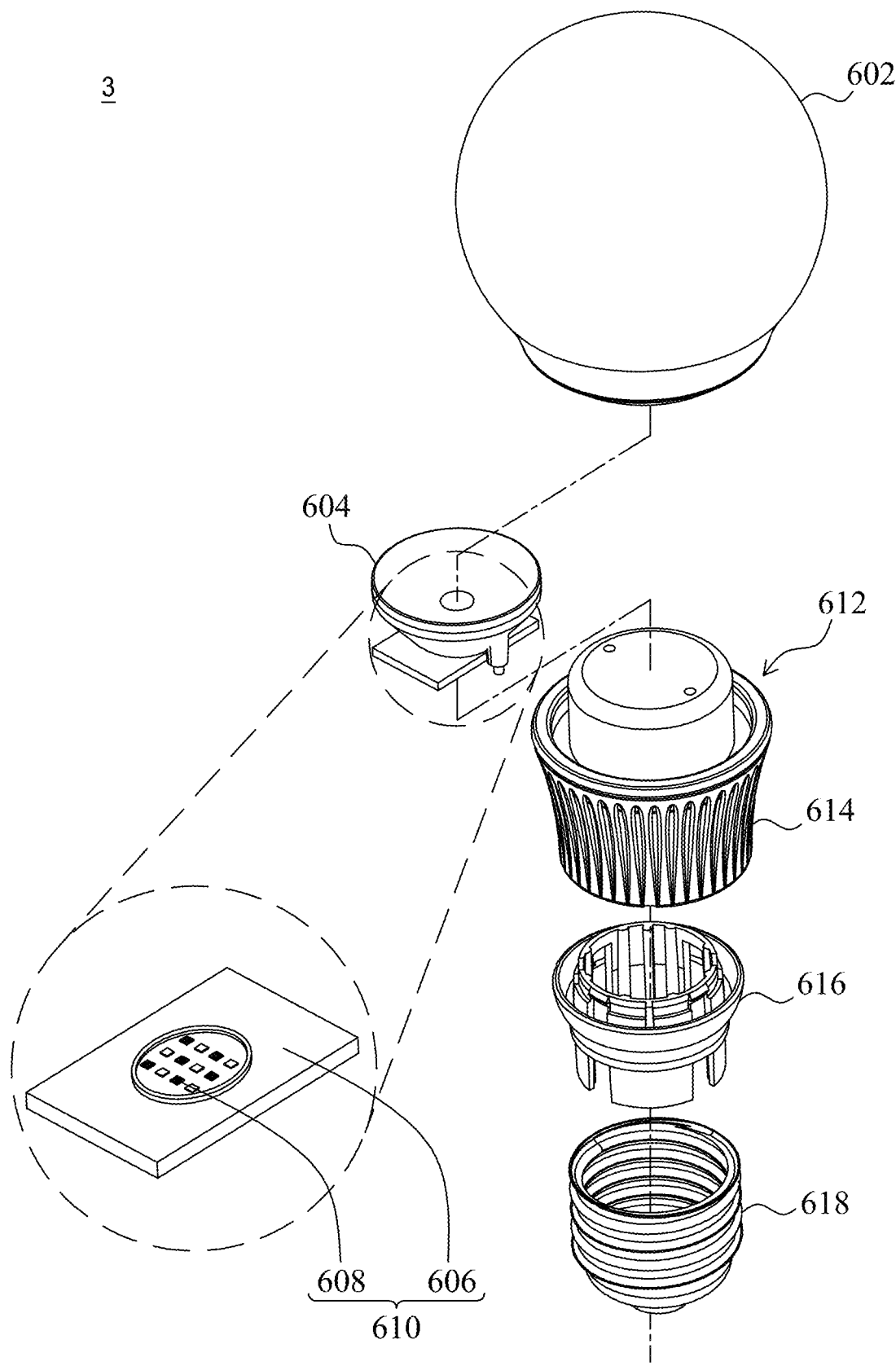
FIG. 15 illustrates a schematic view of a light-emitting apparatus 3 in accordance with an embodiment of the present application.

FIG. 15 illustrates a structure diagram of a light-emitting apparatus 3 in accordance with an embodiment of the present application. A light bulb comprises an envelope 602, a lens 604, a light-emitting module 610, a base 612, a heat sink 614, a connector 616 and an electrical connecting device 618. The light-emitting module 610 comprises a submount 606 and a plurality of light-emitting devices 608 on the submount 606, wherein the plurality of light-emitting devices 608 can be the light-emitting device 1, 1g or the light-emitting apparatus 2 described in above embodiments.

The principle and the efficiency of the present application illustrated by the embodiments above are not the limitation of the application. Any person having ordinary skill in the art can modify or change the aforementioned embodiments. Therefore, the protection range of the rights in the application will be listed as the following claims.

What is claimed is:

1. A light-emitting device, comprising:
a substrate, comprising a top surface and a sidewall;
a semiconductor stack formed on the top surface of the substrate, the semiconductor stack comprising a first semiconductor layer, an active layer and a second semiconductor layer;
a dicing street surrounding the semiconductor stack and on the top surface of the substrate;
an insulating reflective structure covering the semiconductor stack, wherein the insulating reflective structure comprises a first insulating reflective structure opening and a second insulating reflective structure opening;
a first contact electrode formed under the first insulating reflective structure opening, and comprising a first bonding layer and a first conductive layer; and
a second contact electrode formed under the second insulating reflective structure opening, and comprising a second bonding layer and a second conductive layer,
wherein the insulating reflective structure comprises a protective layer covering the semiconductor stack and the dicing street, a reflective layer comprising a Distributed Bragg Reflector structure formed on the protective layer, a cap layer covering the reflective layer, and the first insulating reflective structure opening and the second insulating reflective structure opening extend through the protective layer, the reflective layer, and the cap layer,
wherein the first bonding layer comprises a first recess, and the first bonding layer comprise one part having a first thickness formed under the first recess and contacting the first conductive layer, and another part having a second thickness larger than the first thickness and formed adjacent to the first recess and contacting the first conductive layer, and
wherein the first bonding layer comprises a bottom surface contacting the first conductive layer, and the bottom surface of the first bonding layer comprises an edge portion bent toward the first semiconductor layer.

2. The light-emitting device according to claim 1, wherein the reflective layer comprises an uneven, and the uneven portion comprises an uneven thickness, the uneven portion comprises a plurality of layers, and an end of one of the plurality of layers comprises a wedge shape.

3. The light-emitting device according to claim 1, wherein the reflective layer comprises an uneven portion, the uneven portion comprises a plurality of layers, and a thickness of an end of the plurality of layers gradually decreases in a direction toward the substrate.

4. The light-emitting device according to claim 1, wherein one end of the cap layer comprises a wedge shape.

5. The light-emitting device according to claim 1, wherein a thickness of one end of the cap layer gradually decreases in a direction toward the substrate.

6. The light-emitting device according to claim 1, wherein the top surface of the substrate comprises a horizontal surface and an inclined surface connected to the horizontal surface.

7. The light-emitting device according to claim 6, wherein the protective layer covers the inclined surface of the substrate.

8. The light-emitting device according to claim 6, wherein the reflective layer comprises an uneven portion adjacent to the sidewall of the substrate, and the uneven portion comprises an uneven thickness, and the uneven portion completely or partially covers the inclined surface of the substrate.

9. The light-emitting device according to claim 1, wherein the substrate further comprises a first rough portion formed on the sidewall of the substrate.

10. The light-emitting device according to claim 6, wherein the substrate comprises a second rough portion formed on the inclined surface of the substrate, and the second rough portion is formed on the sidewall of the substrate.

11. The light-emitting device according to claim 9, wherein the substrate further comprises one or a plurality of protrusions protruding from the top surface of the substrate, and the reflective layer comprises a fracture surface corresponding to a position adjacent to a connecting portion between an edge of the protrusion and the top surface of the substrate.

12. The light-emitting device according to claim 11, wherein the reflective layer comprises a surface topography corresponding to the plurality of protrusions of the substrate.

13. The light-emitting device according to claim 1, further comprising a first electrode pad covering the first insulating reflective structure opening and a second electrode pad covering the second insulating reflective structure opening.

14. The light-emitting device according to claim 1, wherein a first step difference between 20 nm and 200 nm is between a bottom of the first recess and a top of the first contact electrode.

15. The light-emitting device according to claim 1, wherein substrate further comprises a plurality of protrusions protruding from the top surface of the substrate.

16. The light-emitting device according to claim 15, wherein the protective layer, the reflective layer or the cap layer comprises a fracture surface portion corresponding to a position adjacent to a connecting portion between an edge of the plurality of protrusions and the top surface of the substrate.

17. The light-emitting device according to claim 1, wherein in a top view of the light-emitting device, the dicing street comprises a first surface area, the semiconductor stack comprises a second surface area, and a ratio of the first surface area to the second surface area is between 10%-50%.

18. The light-emitting device according to claim 1, wherein a sidewall of the first insulating reflective structure opening and a sidewall of the first recess is separated with a minimum distance.

19. The light-emitting device according to claim 18, wherein the minimum distance is between 5 nm and 100 nm.

20. The light-emitting device according to claim 1, wherein the bottom surface of the first bonding layer totally contacts the first conductive layer.

* * * * *